United States Patent [19]
Kim

[11] Patent Number: 6,107,792
[45] Date of Patent: Aug. 22, 2000

[54] TEST BOARD HAVING A PLURALITY OF POWER SUPPLY WIRING PATTERNS

[75] Inventor: Jang Ryeul Kim, Yongin, Rep. of Korea

[73] Assignee: Samsung Electronics Co., Ltd., Suwon, Rep. of Korea

[21] Appl. No.: 09/081,563

[22] Filed: May 19, 1998

[30] Foreign Application Priority Data

Jun. 23, 1997 [KR] Rep. of Korea ............... 97-26452

[51] Int. Cl.[7] .................................................. G01R 31/02
[52] U.S. Cl. ...................... 324/158.1; 324/754; 324/765
[58] Field of Search ............................... 324/158.1, 754, 324/755, 757, 758, 765

[56] References Cited

U.S. PATENT DOCUMENTS

| | | | |
|---|---|---|---|
| 4,516,816 | 5/1985 | Winthrop | 439/70 |
| 5,374,893 | 12/1994 | Koopman et al. | 324/754 |
| 5,506,514 | 4/1996 | Difrancesco | 324/757 |
| 5,921,786 | 7/1999 | Slocum et al. | 439/72 |

*Primary Examiner*—Safet Metjahic
*Assistant Examiner*—Russell M. Kobert
*Attorney, Agent, or Firm*—Jones Volentine, LLP

[57] ABSTRACT

A test board for testing a semiconductor IC device has a plurality of device attachment pads which are to be electrically connected to a plurality of I/O pins of the semiconductor IC device, a plurality of land pads which are to be electrically connected to a plurality of probe pins of a testing apparatus, a plurality of signal wires electrically connecting the device attachment pads to the land pads, and a plurality of power supply wiring patterns for supplying power to the semiconductor IC device. The power supply wiring patterns include both internal power supply wiring patterns which are disposed radially inwardly of the device attachment pads, and external power supply wiring patterns which are disposed radially outwardly of the device attachment pads. When set up for testing, an IC socket is mounted to the test board. Whereas the device attachment pads, land pads and power supply wiring patterns are provided on the back surface of the test board, the IC socket is mounted to the front surface of the test board. The IC socket has a plurality of pins which are received in through-holes of the test board electrically connected to the device attachment pads. The test board of the present invention has an advantage in that the device attachment pads are easily connected to the power supply wiring patterns. Furthermore, the noise of the power supply can be reduced by the power supply wiring patterns.

9 Claims, 2 Drawing Sheets

TEST BOARD HAVING A PLURALITY OF POWER SUPPLY WIRING PATTERNS

BACKGROUND OF THE INVENTION

1. Field of the Invention

The present invention generally relates to a test board which is used for testing semiconductor integrated circuit devices, and more particularly to a test board having a plurality of power supply wiring patterns for testing semiconductor integrated circuit devices which have a large number of input/output (I/O) pins.

2. Description of the Related Art

As semiconductor integrated circuit (IC) devices become more highly integrated to achieve multifunction capability, they require an increasing number of input/out (I/O) pins. In particular, ASICs (Application Specific ICs), comprising gate arrays and standard cells that form the user-specified ICs on a semiconductor wafer, require many I/O pins, unlike common IC devices which are developed, manufactured, and sold with the functions and specifications designated by the semiconductor device manufacturer.

According to the pressing demand to meet these requirements, current packaging technology has developed products having 208 I/O pins or more. However, the size of the semiconductor chip or the chip package has not increased in proportion to the increase in the number of I/O pins, because electronic systems using the IC devices have been increasingly miniaturized. These conflicting trends, that is, the need to accommodate greater functionality and a larger number of I/O pins in a smaller package, makes it difficult to design the wiring patterns for sending a test signal to the IC device having a large number of I/O pins, and to design the wiring patterns through which the output signal from the test board is to be measured.

In particular, in a test board having a capacity of up to 50% of the total number of pins of an IC device having 200 I/O pins or more, it is difficult to keep the power supply wiring patterns from contacting other wiring patterns.

SUMMARY OF THE INVENTION

Accordingly, an object of the present invention is to provide a test board having a plurality of power supply wiring patterns, which can effectively test semiconductor integrated circuit devices having a large number of I/O pins.

Another object of the present invention is to provide a test board on which the power supply wiring patterns and their connections are easy to produce.

To achieve the foregoing objects, the present invention provides a test board for testing a semiconductor IC device. The test board structure includes:

(1) a plurality of device attachment pads which are to be electrically connected to a plurality of I/O pins of the semiconductor IC device;

(2) a plurality of land pads which are to be electrically connected to a plurality of probe pins of a testing apparatus;

(3) a plurality of signal wires electrically connecting the device attachment pads to the land pads; and (4) a plurality of power supply wiring patterns for supplying power to the semiconductor IC device, The power supply wiring patterns comprise internal power supply wiring patterns which are disposed radially inwardly of the device attachment pads, and external power supply wiring patterns which are disposed radially outwardly of the device attachment pads.

When a test board set up is prepared, an IC socket is mounted to the test board. Whereas the device attachment pads, land pads and power supply wiring patterns are provided on the back surface of the test board, the IC socket is mounted to the front surface of the test board. The IC socket has a plurality of pins which are received in through-holes of the test board and are electrically connected to the device attachment pads.

BRIEF DESCRIPTION OF THE DRAWINGS

These and various other features and advantages of the present invention will be described with reference to the accompanying drawings, wherein like reference numerals designate like structural elements, and, in which.

DETAILED DESCRIPTION OF THE PREFERRED EMBODIMENTS

A preferred embodiment of the present invention will be described below with reference to the accompanying drawings.

Figure 1:
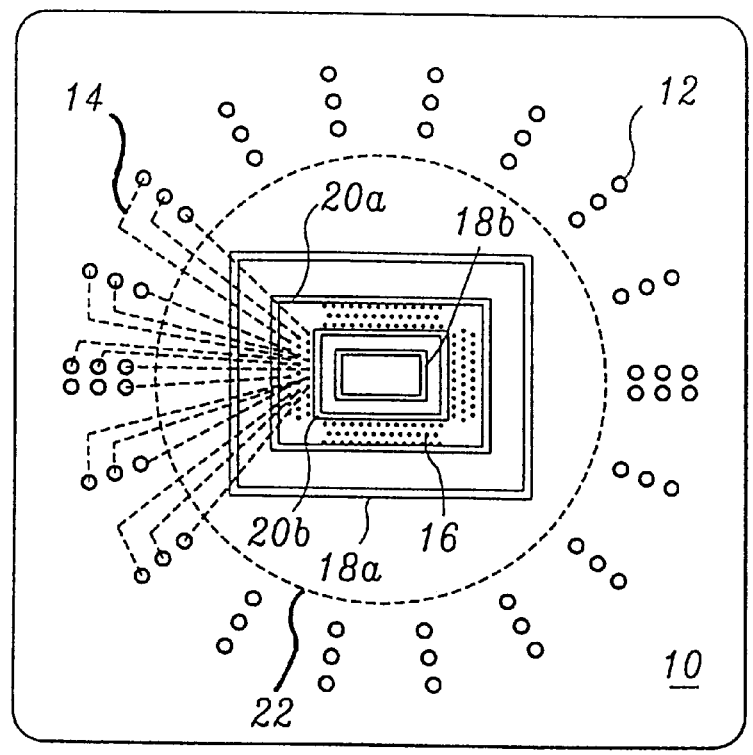
FIG. 1 is a rear view of a test board according to the present invention.

FIG. 1 shows the rear surface of the test board 10. Note that an integrated circuit device to be tested, probe pins of a testing apparatus, and sockets are mounted on the front surface of the test board 10, and will be described later with respect to FIG. 3. As shown in FIG. 1, a plurality of positive power supply wiring patterns, such as Vdd wiring patterns 18a, 18b, and a plurality of negative power supply wiring patterns, such as ground wiring patterns 20a, 20b, are formed on the back surface of the test board 10. The respective power supply wiring patterns 18a, 18b, 20a, 20b have closed loop shapes.

Figure 3:
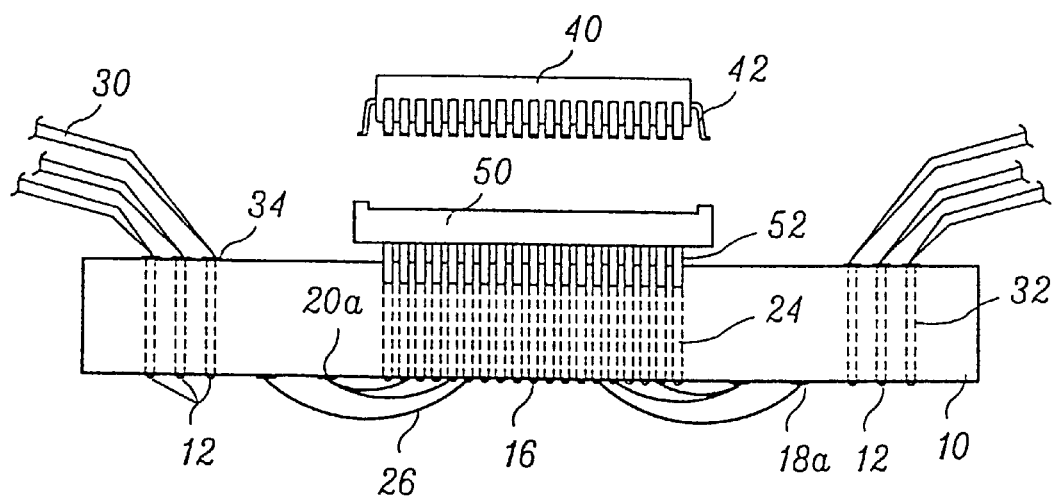
FIG. 3 is a side view of the test board set up according to the present invention depicting the attaching of probe pins to the test board after an integrated circuit device has been mounted on the test board.

A plurality of land pads 12 are spaced radially from one another outside of a certain region 22 on the board (depicted by the dotted circular line) and are connected to probe pin pads 34 (see FIG. 3). The probe pin pads 34 are connected to probe pins 30 of a testing apparatus. As shown in FIGS. 1 and 3, the land pads 12 are for transferring a signal from the IC device 40, being tested, to the testing apparatus. A plurality of device attachment pads 16 are electrically connected to socket pins 52 of a socket 50, on which the IC device 40 is mounted, and are connected to the land pads 12 by signal wires 14, shown as dotted lines in FIG. 1. A protective layer is coated on the test board 10 outwardly of the region 22 on the back surface of the test board 10, in order to protect the circuit wiring patterns formed on the test board 10.

By way of example and not limitation, the device attachment pads 16 are arranged in three rows; other configurations are contemplated. Some of these device attachment pads 16 are for providing the power to the input ones of the I/O pins of the IC device being tested. The power supply wiring patterns, which are located radially outwardly of the device attachment pads 16, are referred to as 'external power supply wiring patterns 18a, 20a'. And, the power supply wiring patterns, which are located radially inwardly of the device attachment pads 16, are referred to as 'internal power supply wiring patterns 18b, 20b'. These device attachment pads 16 are electrically connected to a plurality of the external power supply wiring patterns 18a, 20a and to a plurality of the internal power supply wiring patterns 18b, 20b.

As shown in FIG. 1, the device attachment pads 16 and the power supply wiring patterns 18a, 18b, 20a, 20b are not connected by the signal wires 14. That is, after completing the manufacturing of the test board 10, the device attachment pads 16 are selectively connected electrically to the power supply wiring patterns 18a, 18b, 20a, 20b by external connection wires such as jump wires 26 (see FIG. 3), according to the pin structure or the operational characteristics of the IC device which will be tested. The present invention can thus provide cost savings by allowing many kinds of the IC devices to be tested thereon.

Figure 2:
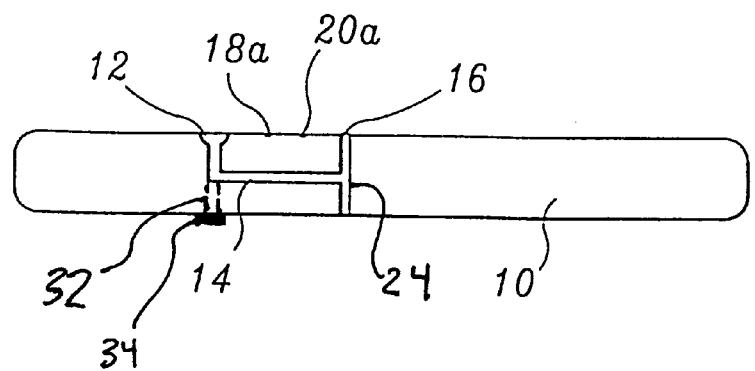
FIG. 2 is a cross-sectional view of the test board according to the present invention.

Because the external power supply wiring patterns 18a, 20a are located between the land pads 12 and the device attachment pads 16, the signal wires 14 pass through the inside of the test board 10, as shown in FIG. 2, in order to electrically connect the land pads 12 to the device attachment pads 16 without causing an electrical short with the external power supply wiring patterns 18a, 20a.

As described above, power supply wiring patterns 18a, 18b, 20a, 20b are provided both outwardly and inwardly of the device attachment pads 16. Accordingly, it is easier to electrically connect the device attachment pads 16 to the power supply wiring patterns, compared to the case in which the power supply wiring patterns of the test board are provided only inwardly of the device attachment pads. In particular, in a test board for testing an IC device having a large number of I/O pins, the number of device attachment pads 16 must be large and the pitch of the device attachment pads 16 must be very fine. It is difficult to connect such a large number of device attachment pads to power supply wiring patterns located only inwardly thereof using external connection wires.

However, in the present invention, because the power supply wiring patterns are formed both radially outwardly and radially inwardly of the device attachment pads 16, it is easy to connect the device attachment pads 16 to the power supply wiring patterns 18a, 18b, 20a, 20b. Further, because the external power supply wiring patterns 18a, 20a are longer than the internal power supply wiring patterns 18b, 20b, the noise level of the power supply can be reduced.

FIG. 3 depicts a test set up wherein probe pins are attached to the test board after an integrated circuit device has been mounted thereon. A plurality of device attachment pads 16 are electrically connected to the power supply wiring patterns 18a, 20a via external connection wires 26. The electrical connections between the device attachment pads 16 and the power supply wiring patterns 18a, 20a are configured according to the type of IC device to be tested. The device attachment pads 16 are electrically connected to a plurality of socket pins 52 of a socket 50 via through-holes 24. These through-holes 24 are plated with a conductive material so as to be electrically conductive. The integrated circuit device 40, which will be tested, is mounted on the socket 50. In the illustrated example, the integrated circuit device 40 is a QFP (Quad Flat Package) device in which a plurality of leads are exposed at four sides of the package. The QFP is appropriate for packaging a semiconductor chip having a large number of I/O pins. The leads 42 of the integrated circuit device 40 are electrically connected to the socket pins 52 of the socket 50, and the socket pins 52 are electrically connected to the probe pins 30 of a testing apparatus (not shown) via the through-holes 24 and the device attachment pads 16.

More specifically, the probe pins 30 contact the probe pin pads 34 formed on the front surface of the test board 10. The probe pin pads 34 are electrically connected to the land pads 12 on the back surface via through-holes 32, and the land pads 12 are electrically connected to the device attachment pads 16 by the signal wires 14 (see FIG. 2).

After the IC device 40 is mounted on the socket 50, the probe pins 30 of the testing apparatus are placed in contact with the probe pin pads 34, and the test signals of a test pattern are transmitted to the IC device 40. After that, the test process is carried out. The test process measures the output produced by the IC device 40 to determine the characteristics and functionality thereof.

After completing the test process of one IC device, the IC device is removed from the socket. Then, the next IC device to be tested is mounted on the socket and the test process is again carried out.

If this IC device is of a type different from the IC device previously tested, the external connection wires 26, which connect the device attachment pads of the test board 10 to the power supply wiring patterns, are reconfigured. Furthermore, the connections between the probe pins 30 and the probe pin pads 34 are reconfigured as well to appropriately test the IC device.

The test board according to the present invention has a plurality of power supply wiring patterns in closed loop shapes, which are provided radially outwardly as well as radially inwardly of the device attachment pads. Therefore, when the IC device to be tested has a great number of I/O pins, the device attachment pads can be easily connected to the power supply wiring patterns. Furthermore, the noise of the power supply can be reduced owing to the use of the plurality of power supply wiring patterns.

Although a preferred embodiment of the present invention has been described in detail hereinabove, it should be clearly understood that many variations and/or modifications of the basic inventive concepts taught herein will become apparent to those skilled in the art. All such variations and/or modifications are thus seen to be within the true spirit and scope of the present invention as defined by the appended claims.

What is claimed is:

1. A test board for testing a semiconductor integrated circuit (IC) device, said test board comprising:

a front surface and a back surface;

a plurality of device attachment pads for electrical connection to a plurality of input/output (I/O) pins of the semiconductor IC device;

a plurality of land pads for electrical connection to a plurality of probe pins of a testing apparatus;

a plurality of signal wires electrically connecting the device attachment pads to the land pads; and a plurality of power supply wiring patterns for providing the power supply to the semiconductor IC device, the power supply wiring patterns comprising internal power supply wiring patterns and external power supply wiring patterns, wherein the power supply wiring patterns and the device attachment pads are arranged concentrically on the test board such that the internal power supply wiring patterns are located adjacent to a center of the test board, the external power supply wiring patterns are located distant from the center of the test board, and the device attachment pads are located between the internal and external power supply wiring patterns.

2. A test board for testing a semiconductor IC device, as claimed in claim 1, further comprising external connection wires electrically connecting the internal and the external power supply wiring patterns to the device attachment pads.

3. A test board for testing a semiconductor IC device, as claimed in claim 2, wherein the external connection wires are jump wires.

4. A test board for testing a semiconductor IC device, as claimed in claim 1, wherein the device attachment pads, the land pads and the power supply wiring patterns are formed on the back surface of the test board, and further comprising a socket having a plurality of socket pins mounted at the front surface of the test board, said socket pins being electrically connected to the device attachment pads.

5. A test board for testing a semiconductor IC device, as claimed in claim 4, and further comprising a plurality of probe pin pads, for contacting probe pins of a testing apparatus, disposed on the front surface of the test board and electrically connected to the land pads on the back surface of the test board.

6. A test board for testing a semiconductor IC device, as claimed in claim 4, wherein the socket pins and the device attachment pads are electrically connected to each other via through-holes which extend through the test board from the front surface to the back surface thereof.

7. A test board for testing a semiconductor IC device, as claimed in claim 4, wherein said signal wires extend inside of the test board intermediate the front and the back surfaces thereof.

8. A test board for testing a semiconductor IC device, as claimed in claim 1, wherein said power supply wiring patterns include positive power supply wiring patterns and negative power supply wiring patterns.

9. A test board for testing a semiconductor IC device, as claimed in claim 1, wherein each of said power supply wiring patterns has the shape of a closed loop.

\* \* \* \* \*